United States Patent
Onimaru et al.

(10) Patent No.: US 10,186,690 B2
(45) Date of Patent: Jan. 22, 2019

(54) DISPLAY PANEL MANUFACTURING METHOD AND DISPLAY PANEL

(71) Applicant: JOLED INC., Tokyo (JP)

(72) Inventors: Toshiaki Onimaru, Tokyo (JP); Tetsuro Kondo, Tokyo (JP)

(73) Assignee: JOLED INC., Tokyo (JP)

( * ) Notice: Subject to any disclaimer, the term of this patent is extended or adjusted under 35 U.S.C. 154(b) by 282 days.

(21) Appl. No.: 15/202,816

(22) Filed: Jul. 6, 2016

(65) Prior Publication Data
US 2017/0125746 A1    May 4, 2017

(30) Foreign Application Priority Data
Nov. 2, 2015    (JP) .................................. 2015-216157

(51) Int. Cl.
| H01L 29/08 | (2006.01) |
| H01L 51/56 | (2006.01) |
| H01L 51/52 | (2006.01) |

(52) U.S. Cl.
CPC .......... H01L 51/56 (2013.01); H01L 51/5203 (2013.01)

(58) Field of Classification Search
CPC ....................................... H01L 51/56
USPC ........................................... 257/40
See application file for complete search history.

(56) References Cited

U.S. PATENT DOCUMENTS

| 7,234,984 | B2 | 6/2007 | Nishikawa et al. |
| 7,258,586 | B2 | 8/2007 | Tamura et al. |
| 7,611,745 | B2 | 11/2009 | Nishikawa et al. |
| 2002/0181119 | A1* | 12/2002 | Sullivan ................. G02B 26/10 359/641 |
| 2003/0222861 | A1 | 12/2003 | Nishikawa et al. |
| 2004/0202777 | A1 | 10/2004 | Nishikawa et al. |
| 2004/0217695 | A1* | 11/2004 | Yoneda ............... H01L 27/3246 313/504 |
| 2005/0052506 | A1* | 3/2005 | Yagi .................... B41J 2/14233 347/72 |
| 2005/0215163 | A1 | 9/2005 | Tamura et al. |

FOREIGN PATENT DOCUMENTS

| JP | 2003-178871 | 6/2003 |
| JP | 2004-227852 | 8/2004 |
| JP | 2005-276600 | 10/2005 |
| JP | 2008-235177 | 10/2008 |

* cited by examiner

*Primary Examiner* — Ajay K Arora
(74) *Attorney, Agent, or Firm* — Greenblum & Bernstein, P.L.C.

(57) ABSTRACT

Provided is an organic EL display panel manufacturing method. The organic EL display panel includes a plurality of semiconductor elements. The method includes: forming, on a planarization film formed above the semiconductor elements, lower electrodes in one-to-one correspondence with the pixels; forming an organic layer including a light-emitting layer on the lower electrodes; forming an upper electrode on the organic layer; detecting any of the lower electrodes that includes a defect; and forming, on the planarization film or any of the lower electrodes that includes a defect, a protrusion for connecting the lower electrode and the upper electrode.

14 Claims, 11 Drawing Sheets

DISPLAY PANEL MANUFACTURING METHOD AND DISPLAY PANEL

CROSS REFERENCE TO RELATED APPLICATION

The present application is based on and claims priority of Japanese Patent Application No. 2015-216157 filed on Nov. 2, 2015. The entire disclosure of the above-identified application, including the specification, drawings and claims is incorporated herein by reference in its entirety.

FIELD

The present invention relates to a display panel manufacturing method and a display panel.

BACKGROUND

Conventionally, there has been known a display panel that includes an organic electroluminescence (hereinafter referred to as "organic EL") element including an anode (positive electrode), a cathode (negative electrode), and an organic layer including a light-emitting layer interposed between the cathode and the anode. In a display panel including the organic EL element, a defect may occur during the manufacturing process. For example, the negative electrode and the positive electrode may be shorted by an electrically conductive foreign substance entering into the organic EL element of the display panel, or the anode and the cathode may be directly shorted due to missing of the light-emitting layer formed between the negative electrode and the positive electrode. In this case, a defective pixel including a defect will experience problems such as a dark spot state in which the pixel is constantly unlit, a bright spot state in which the pixel is constantly lit, an unstable lighting state, and the like. In the case where such problems arise, techniques are available for repairing (eliminating) the defective pixel so as to prevent the shorting from affecting the operation of the organic EL element (e.g., see Patent Literatures 1 to 4).

With the techniques disclosed in Patent Literatures 1 to 4, the defective pixel is repaired, for example, by irradiating the defective pixel with laser light to increase the resistance of the positive electrode, the negative electrode, or the light-emitting layer formed between the positive electrode and the negative electrode, or to destroy these components.

CITATION LIST

Patent Literature

[Patent Literature 1] Japanese Unexamined Patent Application Publication No. 2004-227852
[Patent Literature 2] Japanese Unexamined Patent Application Publication No. 2003-178871
[Patent Literature 3] Japanese Unexamined Patent Application Publication No. 2005-276600
[Patent Literature 4] Japanese Unexamined Patent Application Publication No. 2008-235177

SUMMARY

Technical Problem

However, with the methods in which repair is performed by laser irradiation in the above-described manner, laser light will not reach a defective area if the defect is located at a deep position away from the substrate surface, such as in a semiconductor element or a lower electrode, and it may be thus difficult to repair the defective pixel with laser light.

Therefore, in view of the above-described problems, it is an object of the present invention to provide a display panel manufacturing method and a display panel that enable a defective pixel to be repaired even when it is difficult to perform laser irradiation.

Solution to Problem

In order to solve the above-described problems, a display panel manufacturing method according to an embodiment of the present invention is a display panel manufacturing method for manufacturing a display panel including pixels each having an organic electroluminescent element, the display panel including a plurality of semiconductor elements, the method including: forming, on a planarization film formed above the semiconductor elements, lower electrodes in one-to-one correspondence with the pixels; forming an organic layer including a light-emitting layer on the lower electrodes; forming an upper electrode on the organic layer; detecting any of either the semiconductor elements or the lower electrodes that includes a defect; and forming, on the planarization film or any of the lower electrodes that includes a defect, a protrusion for connecting the lower electrode and the upper electrode.

In order to solve the above-described problems, a display panel according to an embodiment of the present invention is a display panel including pixels each having an organic electroluminescent element, including: a plurality of semiconductor elements formed on a substrate; a planarization film formed above the plurality of semiconductor elements; lower electrodes formed on the planarization film in one-to-one correspondence with the pixels; an organic layer formed on the lower electrodes and including a light-emitting layer; an upper electrode formed on the organic layer; and a protrusion formed on the planarization film or the lower electrodes for connecting the lower electrodes and the upper electrode, wherein at least one lower electrode among the lower electrodes includes a defect, and the protrusion is formed on the at least one lower electrode including a defect.

In order to solve the above-described problems, a display panel according to an embodiment of the present invention is a display panel including pixels each having an organic electroluminescent element, including: a plurality of semiconductor elements formed on a substrate; a planarization film formed above the plurality of semiconductor elements; lower electrodes formed on the planarization film in one-to-one correspondence with the pixels; an organic layer formed on the lower electrodes and including a light-emitting layer; an upper electrode formed on the organic layer; and a protrusion formed on the planarization film or the lower electrodes for connecting the lower electrodes and the upper electrode, wherein at least one semiconductor element among the plurality of semiconductor elements includes a defect, and the protrusion is formed on the planarization film located above the at least one semiconductor element including a defect or on the lower electrodes.

Advantageous Effects

With the display panel manufacturing method according to the present invention, it is possible to provide a display panel manufacturing method and a display panel that enable a defective pixel to be repaired even when it is difficult to perform laser irradiation.

BRIEF DESCRIPTION OF DRAWINGS

These and other objects, advantages and features of the invention will become apparent from the following description thereof taken in conjunction with the accompanying drawings that illustrate a specific embodiment of the present invention.

DESCRIPTION OF EMBODIMENTS

A display panel manufacturing method according to the present invention is a display panel manufacturing method for manufacturing a display panel including pixels each having an organic electroluminescent element, the display panel including a plurality of semiconductor elements, the method including: forming, on a planarization film formed above the semiconductor elements, lower electrodes in one-to-one correspondence with the pixels; forming an organic layer including a light-emitting layer on the lower electrodes; forming an upper electrode on the organic layer; detecting any of either the semiconductor elements or the lower electrodes that includes a defect; and forming, on the planarization film or any of the lower electrodes that includes a defect, a protrusion for connecting the lower electrode and the upper electrode.

According to the present aspect, even when a defect is located at a deep position away from the substrate surface, such as in a semiconductor element or a lower electrode, and it is thus difficult to repair the defect with laser light, it is possible to repair the defective pixel by shorting the lower electrode and the upper electrode.

At least one lower electrode among the lower electrodes may include a defect, and in the forming of the protrusion, the protrusion may be formed on the at least one lower electrode including a defect.

According to the present aspect, by forming the protrusion on a lower electrode when a defect is located in the lower electrode, it is possible to short the lower electrode and the upper electrode by the protrusion. This makes it possible to repair the defective pixel.

At least one semiconductor element among the plurality of semiconductor elements may include a defect, and in the forming of the protrusion, the protrusion may be formed on the planarization film located above the at least one semiconductor element including a defect.

According to the present aspect, by forming the protrusion on the planarization film located above the semiconductor element when the semiconductor element has a defect, the lower electrode to be formed on the protrusion can be formed in conformity with the shape of the protrusion. This makes it possible to short the lower electrode formed in conformity with the shape of the protrusion and the upper electrode, thus allowing the defective pixel to be repaired.

In the forming of the protrusion, the protrusion may be formed by applying an electrically conductive material.

According to the present aspect, it is possible to easily form the protrusion, and enable the upper electrode and the lower electrode to be easily shorted.

A display panel according to the present invention is a display panel including pixels each having an organic electroluminescent element, including: a plurality of semiconductor elements formed on a substrate; a planarization film formed above the plurality of semiconductor elements; lower electrodes formed on the planarization film in one-to-one correspondence with the pixels; an organic layer formed on the lower electrodes and including a light-emitting layer; an upper electrode formed on the organic layer; and a protrusion formed on the planarization film or the lower electrodes for connecting the lower electrodes and the upper electrode, wherein at least one lower electrode among the lower electrodes includes a defect, and the protrusion is formed on the at least one lower electrode including a defect.

According to the present aspect, when a lower electrode has a defect, the lower electrode and the upper electrode can be shorted by the protrusion formed on the lower electrode. This makes it possible to repair the defective pixel.

A display panel according to the present invention is a display panel including pixels each having an organic electroluminescent element, including: a plurality of semiconductor elements formed on a substrate; a planarization film formed above the plurality of semiconductor elements; lower electrodes formed on the planarization film in one-to-one correspondence with the pixels; an organic layer formed on the lower electrodes and including a light-emitting layer; an upper electrode formed on the organic layer; and a protrusion formed on the planarization film or the lower electrodes for connecting the lower electrodes and the upper electrode, wherein at least one semiconductor element among the plurality of semiconductor elements includes a defect, and the protrusion is formed on the planarization film located above the at least one semiconductor element including a defect or on the lower electrodes.

According to the present aspect, by forming the protrusion on the planarization film located above the semiconductor element when the semiconductor element has a defect, the lower electrode formed in conformity with the shape of the protrusion and the upper electrode can be shorted. This makes it possible to repair the defective pixel.

The protrusion may be formed of an electrically conductive material.

According to the present aspect, it is possible to easily short the upper electrode and the lower electrode.

Hereinafter, a display panel manufacturing method and a display panel according to embodiments of the present invention will be described with reference to the drawings. Note that each of the embodiments described below merely shows a specific example. The numerical values, shapes, materials, components, the arrangement and connection of the components, steps, the order of the steps and so forth shown in the following embodiments are mere examples, and are not intended to limit the present invention. Of the components in the following embodiments, components not recited in any of the independent claims, which represent the broadest concept, are described as optional components. In the following, the same or corresponding elements are denoted by the same reference numerals throughout all drawings, and redundant description thereof shall be omitted.

Embodiment 1

In the following, Embodiment 1 of the present invention will be described with reference to the drawings. In the present embodiment, a display panel manufacturing method and a display panel according to the present embodiment will be described, taking, as an example, an organic EL display panel including an organic EL element including a defect in a lower electrode.

Figure 1:
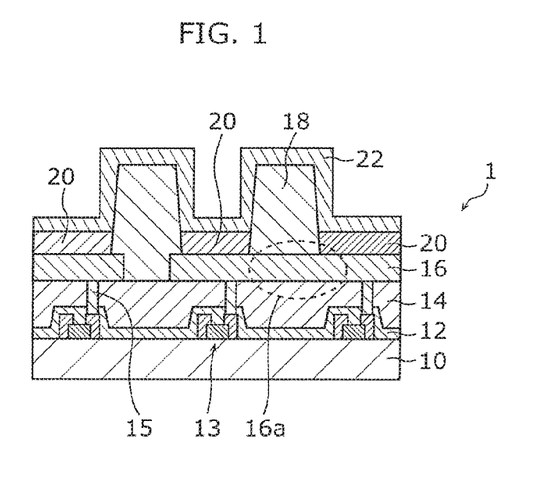
FIG. 1 is a schematic cross-sectional view of a display panel including a defect in a lower electrode.

First, an object of the present invention will be described in further detail. FIG. 1 is a schematic cross-sectional view of an organic EL display panel 1 including a defect in a lower electrode.

As shown in FIG. 1, the organic EL display panel 1 includes, on a substrate 10, a semiconductor layer 12, a planarization film 14, lower electrodes 16, an organic layer 20, and an upper electrode 22. A plurality of semiconductor elements 13 are formed in the semiconductor layer 12. The lower electrodes 16 are connected to at least one of the plurality of semiconductor elements 13.

A bank 18 is formed on the planarization film 14, and regions surrounded by the bank 18 serve as pixels. Here, the lower electrodes 16 formed below the organic layer 20 are usually separated by the bank 18 in one-to-one correspondence with the pixels. However, due to a patterning failure or the like during formation of the lower electrodes 16, the organic EL display panel 1 has a shorted area 16a where the lower electrodes 16 of adjacent pixels are in conduction with each other.

When the shorted area 16a is present in the lower electrodes 16, adjacent pixels cannot be lit at their respective desired brightnesses because the light emission states of the pixels affect each other. To solve this problem, an organic EL display panel 2 according to the present embodiment has the following configuration.

1-1. Configuration of Organic EL Element

Figure 2:
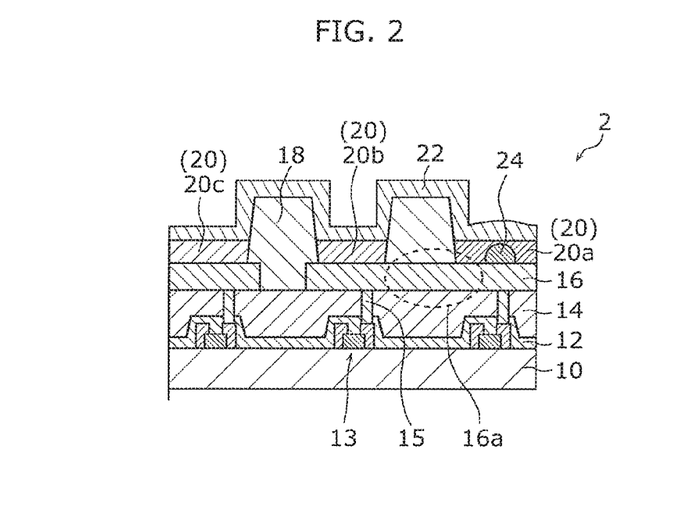
FIG. 2 is a schematic cross-sectional view showing a configuration of a display panel according to Embodiment 1.

In the following, a configuration of the organic EL element according to the present embodiment will be described. FIG. 2 is a schematic cross-sectional view showing an organic EL display panel 2 according to the present embodiment.

As shown in FIG. 2, the organic EL display panel 2 is an organic functional device including, above a substrate 10, a planarization film 14, lower electrodes 16, an organic layer 20, a bank 18, and an upper electrode 22. Note that in the present disclosure, the planarization film 14, the lower electrode 16, the organic layer 20, the upper electrode 22, a thin film sealing layer, a sealing resin layer, and a transparent glass that are disposed in each regions separated by the bank 18 are referred to as a "pixel". The lower electrode 16, the organic layer 20, and the upper electrode 22 are referred to as an "organic EL element".

The substrate 10 is a substrate composed of sapphire, for example.

A semiconductor layer 12 is formed on the substrate 10. A plurality of semiconductor elements 13 are formed in the semiconductor layer 12. Each semiconductor element 13 is a driving thin film transistor (TFT), for example.

A planarization film 14 is formed on the semiconductor layer 12. The planarization film 14 is composed of an insulating organic material, for example. In addition, vias 15 are formed in portions of the planarization film 14 that are located above the semiconductor elements 13. Each via 15 is formed by filling an electrically conductive material into a through-hole extending from the upper surface of the planarization film 14 to the semiconductor element 13.

A plurality of lower electrodes 16 are formed on the planarization film 14 so as to cover the vias 15. Each of the plurality of lower electrodes 16 is connected to at least one of the plurality of semiconductor elements 13 through the corresponding via 15.

Each lower electrode 16 is a positive electrode to which holes are supplied, or in other words, an anode into which a current flows from an external circuit. The lower electrode 16 is formed on the planarization film 14 for each pixel. That is, in the organic EL display panel 2, a plurality of lower electrodes 16 are formed on the planarization film 14. The lower electrode 16 has a structure in which a reflective electrode made of, for example, Al or a silver-palladium-copper alloy (silver alloy APC) is deposited on the planarization film 14. In this case, the thickness of the reflective electrode is 500 nm or less, for example. Note that the lower electrode 16 may have a two-layer structure composed of, for example, Indium Tin Oxide (ITO) and the silver alloy APC or the like.

The organic layer 20 includes light-emitting layer that emits light by application of a voltage between the lower electrodes 16 and the upper electrode 22. The thickness of the light-emitting layer is 150 nm or less, for example.

The light-emitting layer has a structure in which, for example, α-NPD(Bis[N-(1-naphthyl)-N-phenyl]benzidine) serving as a lower layer and Alq$_3$(tris-(8-hydroxyquinoline) aluminum) serving as an upper layer are stacked.

Note that the organic layer 20 may include a hole injection layer between the light-emitting layer and the lower electrodes 16, and an electron injection layer between the light-emitting layer and the upper electrode 22. In this case, the hole injection layer, the light-emitting layer, and the electron injection layer are collectively referred to as the organic layer 20. Furthermore, the organic layer 20 may include a hole transport layer between the hole injection layer and the light-emitting layer, and an electron transport layer between the electron injection layer and the light-emitting layer. In this case, the hole injection layer, the hole transport layer, the light-emitting layer, the electron transport layer, and the electron injection layer are collectively referred to as the organic layer 20. At this time, the thickness of the organic layer 20 is 100 nm or more and 200 nm or less, for example.

The hole injection layer is a layer mainly composed of a hole injecting material. The hole injecting material is a material having the function for stably injecting the holes injected from the lower electrode 16 side to the organic layer 20, or assisting generation of holes and injecting the holes into the organic layer 20. For example, compounds such as polyethylenedioxythiophene (PEDOT) and aniline can be used.

The electron injection layer is a layer mainly composed of an electron injecting material. The electron injecting material is a material having the function for stably injecting the electrons injected from the upper electrode 22 into the organic layer 20, or assisting generation of electrons and injecting the electrons into the organic layer 20. For example, polyphenylene vinylene (PPV) can be used.

The hole transport layer is a layer mainly composed of a hole transporting material. The hole transporting material is a material that has electron donor properties and a tendency to become positive ions (holes), as well as a property of transmitting the generated holes by charge transfer reaction between molecules, and is suitable for transporting charges from the lower electrodes 16 to the organic layer 20.

The electron transport layer is a layer mainly composed of an electron transporting material. The electron transporting material is a material that has electron acceptor properties and a tendency to become negative ions, as well as a property of transmitting the generated electrons by charge transfer reaction between molecules, and is suitable for transporting charges from the upper electrode 22 to the organic layer 20.

The upper electrode 22 is a negative electrode to which electrons are supplied, or in other words, a cathode from which a current flows out to an external circuit. The upper electrode 22 may be composed of a single layer, or may have a configuration in which a plurality of layers are stacked. For example, the upper electrode 22 may have a configuration in which an ITO layer, which is a transparent metal oxide, and a metal layer are stacked. In this case, the ITO layer is formed of materials such as Mg and Ag. The metal layer is formed of a material having a higher refractive index than that of the ITO layer, for example, a material such as silver (Ag), a silver alloy APC, or magnesium (Mg). Consequently, light exiting from the organic EL display panel 2 is refracted at the metal layer so as to be collected, and it is therefore possible to increase the strength of the cavities of the organic EL display panel 2. Note that the thickness of the ITO layer is, for example, 30 nm or more and 90 nm or less, the thickness of the metal layer is, for example, 15 nm or more and 30 nm or less, and the thickness of the upper electrode 22 is, for example, 45 nm or more and 20 nm or less.

The bank 18 is a wall for separating the organic layer 20 into a plurality of pixels, and is made of a photosensitive resin, for example.

The organic EL display panel 2 further includes, on the upper electrode 22, a thin film sealing layer, a sealing resin layer, and a transparent glass, which are not shown.

The thin film sealing layer is made of, for example, silicon nitride, and has the function for isolating the organic layer 20 and the upper electrode 22 described above from water vapor and oxygen. As a result of forming the thin film sealing layer, the organic EL display panel 2 can prevent degradation (oxidation) of the organic layer 20 itself and the upper electrode 22 due to exposure to water vapor and oxygen.

The sealing resin layer is an acrylic or epoxy resin, and has the function for bonding the above-described integrated layer, which includes the planarization film 14 through the thin film sealing layer formed above the substrate, to the transparent glass.

The transparent glass is a substrate for protecting the light-emitting surface of a light-emitting panel, and is a transparent, alkali-free glass having a thickness of 0.5 mm, for example.

The organic EL display panel 2 may have a configuration in which color filters for adjusting the colors of red, green and blue are further provided under the transparent glass so as to cover the pixels separated by the bank 18.

The above-described configuration composed of the lower electrodes 16, the organic layer 20 and the upper electrode 22 is a basic configuration of the organic EL display panel 2. With this configuration, when an appropriate voltage is applied between the lower electrodes 16 and the upper electrode 22, electrons and holes are injected into the organic layer 20 from the lower electrode 16 side and the upper electrode 22 side, respectively. The energy generated as a result of recombination of these injected holes and electrons in the organic layer 20 causes the light-emitting material of the organic layer 20 to be excited to emit light.

Furthermore, the organic EL display panel 2 shown in FIG. 2 has a defect in at least one of the plurality of lower electrodes 16 during the manufacturing process. Specifically, the organic EL display panel 2 has a defect in that the lower electrodes 16 of adjacent pixels are connected to each other and shorted. This shorting causes a light emission problem, for example, that the pixels whose lower electrodes 16 are shorted affect each other and cannot be lit at the desired brightnesses. To solve this problem, the organic EL display panel 2 includes a protrusion 24 on the lower electrode 16 including a defect.

The protrusion 24 is composed of, for example, an electrically conductive material such as indium. The protrusion 24 is formed in a protruding shape on the lower electrode 16 including a defect, and electrically connects the lower electrode 16 on which the protrusion 24 is formed to the upper electrode 22 formed thereabove. Since the lower electrode 16 and the upper electrode 22 are shorted by the protrusion 24, a current does not flow through the organic layer 20 in the pixel including the lower electrode 16 with a defect, and the pixel is changed into a dark spot. Therefore, it is possible to solve a light emission problem, for example, that the pixels whose lower electrodes 16 are shorted and cannot be lit at the desired brightnesses.

1-2. Manufacturing Method of Organic EL Element

Figure 3:
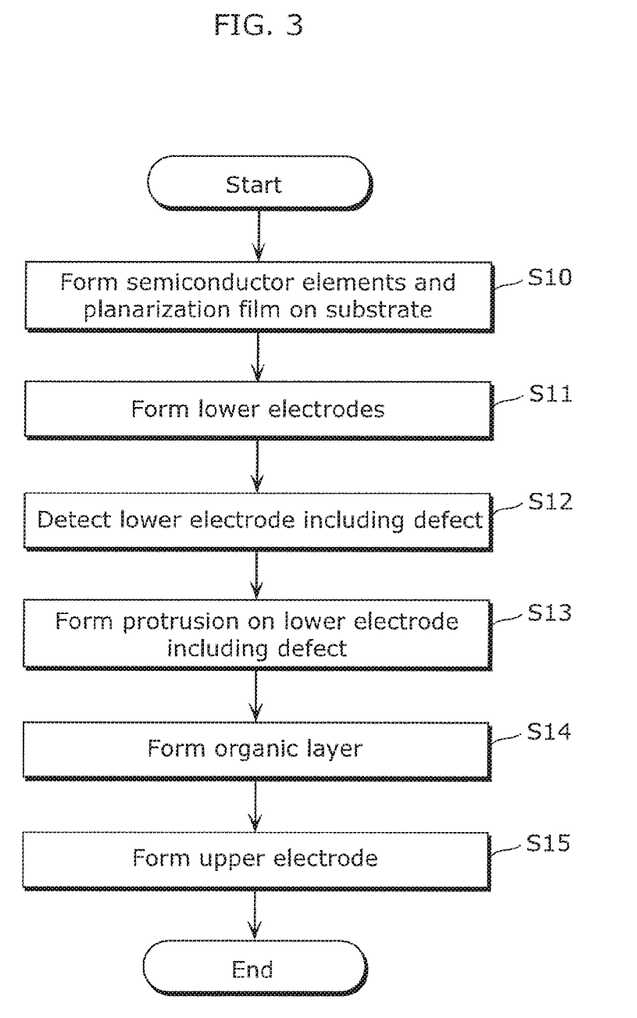
FIG. 3 is a flowchart illustrating a manufacturing process of the display panel according to Embodiment 1.

In the following, a manufacturing method of the organic EL display panel 2 will be described with reference to FIGS. 3 to 13. FIG. 3 is a flowchart illustrating a manufacturing process of an organic EL element according to the present embodiment. FIGS. 4 to 13 are schematic cross-sectional views showing the manufacturing process of the organic EL element according to the present embodiment.

The following description will be given with reference to the flowchart in FIG. 3.

Figure 4:
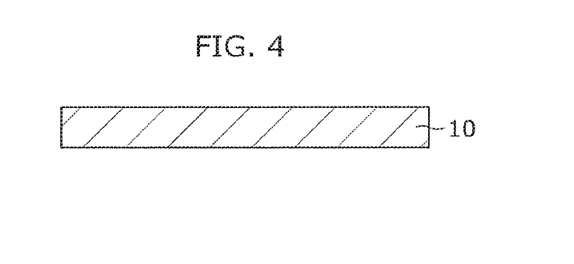
FIG. 4 is a schematic cross-sectional view showing the manufacturing process of the display panel according to Embodiment 1.

First, as shown in FIG. 4, a substrate 10 is provided. The substrate 10 is a sapphire substrate, for example.

Figure 5:
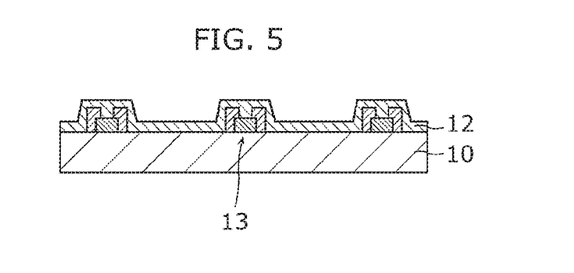
FIG. 5 is a schematic cross-sectional view showing the manufacturing process of the display panel according to Embodiment 1.

Next, as shown in FIG. 5, a semiconductor layer 12 including semiconductor elements 13 is formed on the substrate 10 (step S10). Each semiconductor element 13 is, for example, a TFT. The semiconductor element 13 is formed by depositing and patterning a semiconductor material at a predetermined position in a predetermined shape.

Figure 6:
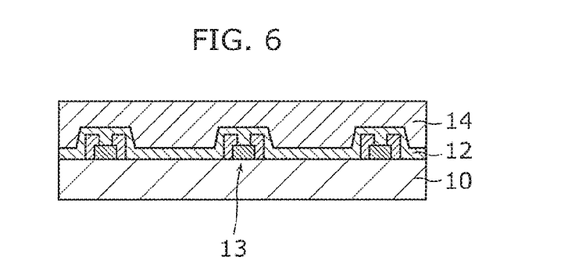
FIG. 6 is a schematic cross-sectional view showing the manufacturing process of the display panel according to Embodiment 1.
Figure 7:
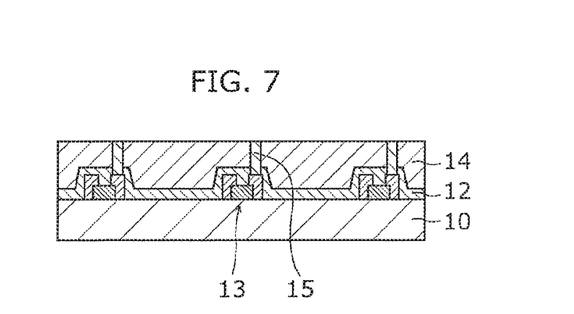
FIG. 7 is a schematic cross-sectional view showing the manufacturing process of the display panel according to Embodiment 1.

Next, as shown in FIG. 6, a planarization film 14 made of an insulating organic material is formed on the semiconductor layer 12 (step S10). Thereafter, as shown in FIG. 7, through-holes extending from the surface of the planarization film 14 to the plurality of semiconductor elements 13 are formed at the locations of the semiconductor elements 13. Furthermore, an electrically conductive material is filled into the through-holes. This completes vias 15.

Figure 8:
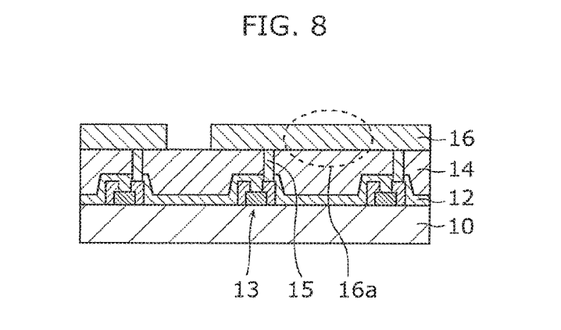
FIG. 8 is a schematic cross-sectional view showing the manufacturing process of the display panel according to Embodiment 1.

Subsequently, as shown in FIG. 8, lower electrodes 16 are formed on the planarization film 14 (step S11). The lower electrodes 16 are formed by deposition and patterning. First, Al is deposited on the planarization film 14 by sputtering so as to have a thickness of 300 nm. Subsequently, the deposited Al is patterned into a predetermined shape by photolithography and wet etching. At this time, Al is patterned into a shape that connects to at least one of the plurality of semiconductor elements 13. This completes a plurality of lower electrodes 16.

Here, as shown in FIG. 8, a shorted area 16a where the lower electrodes 16 of adjacent pixels are in conduction with each other may be formed as a result of a patterning failure or the like during formation of the lower electrodes 16 described above. For this reason, a lower electrode 16 including a defect is detected after the formation of the lower electrodes 16 (step S12).

A lower electrode 16 including a defect is detected, for example, by capturing, with an imaging device equipped with a microscope, an image of the plane of the substrate on which the formation of the lower electrodes 16 has ended, and visually inspecting the captured image to detect an area where the lower electrodes 16 are in conduction with each other. Note that the lower electrode 16 including a defect may not be necessarily detected by visual inspection of the captured image, and may be detected, for example, by an electrical method such as detecting a current flow by bringing a probe into contact therewith.

Figure 9:
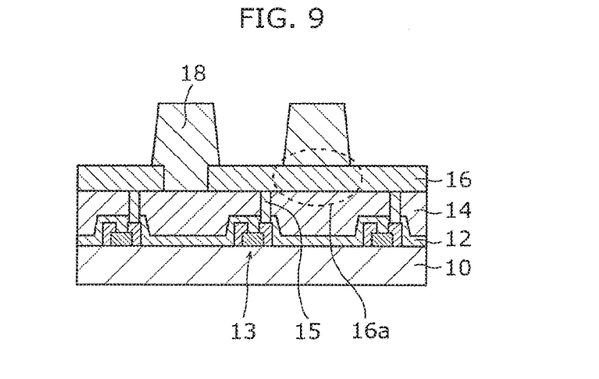
FIG. 9 is a schematic cross-sectional view showing the manufacturing process of the display panel according to Embodiment 1.

Next, as shown in FIG. 9, a bank 18 is formed on the planarization film 14 and the lower electrodes 16. The bank 18 is formed by applying a surface-photosensitive resin so as to cover the planarization film 14 exposed between adjacent lower electrodes 16.

At this time, the bank 18 is formed on portions of the lower electrodes 16 as well. Note that the planarization film 14 is not exposed in the shorted area 16a describe above, and therefore, the bank 18 is formed on the shorted area 16a.

Figure 10:
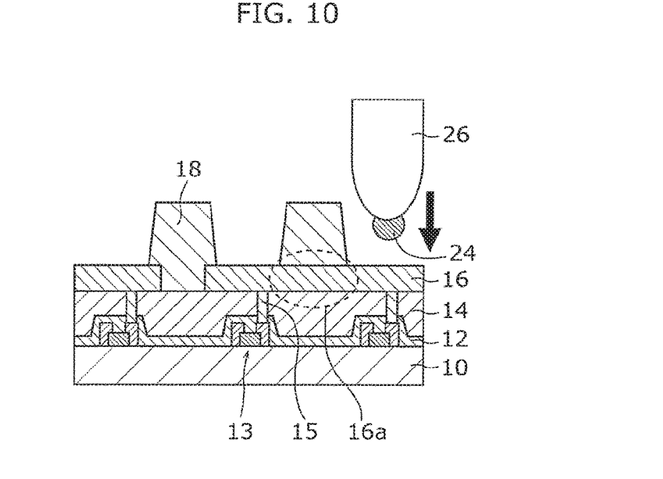
FIG. 10 is a schematic cross-sectional view showing the manufacturing process of the display panel according to Embodiment 1.
Figure 11:
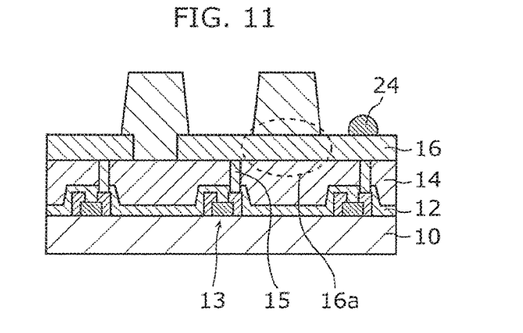
FIG. 11 is a schematic cross-sectional view showing the manufacturing process of the display panel according to Embodiment 1.

Subsequently, as shown in FIGS. 10 and 11, a protrusion 24 is formed on the lower electrode 16 having the shorted area 16a (step S13). The protrusion 24 is formed, for example, by using a coating needle 26 for use in applying the material of the bank 18 or the organic layer 20 during formation of these components. Using the coating needle 26, an electrically conductive paste serving as the material for constituting the protrusion 24 is added dropwise onto at least a portion on the lower electrode 16 having the shorted area 16a. Then, the added conductive paste is dried, thus completing a protrusion 24.

Figure 12:
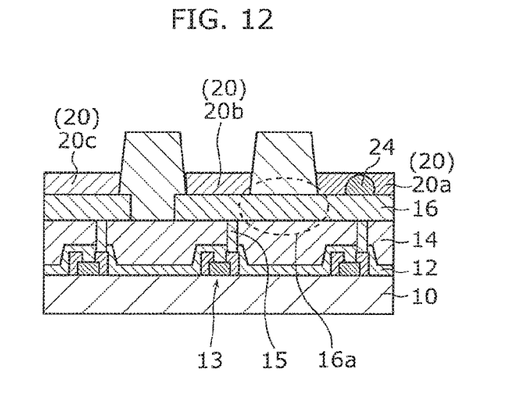
FIG. 12 is a schematic cross-sectional view showing the manufacturing process of the display panel according to Embodiment 1.

Furthermore, as shown in FIG. 12, an organic layer 20 (20a, 20b, and 20c) is formed on each of the lower electrodes 16 separated into a plurality of pixels by the bank 18 (step S14). Note that in the lower electrode 16 on which the protrusion 24 is formed, the organic layer 20 is formed on the lower electrode 16 so as to cover the protrusion 24. Here, a description will be given, taking, as an example, an organic layer including a hole injection layer and an electron injection layer in addition to a light-emitting layer.

First, a hole injection layer is formed on the lower electrodes 16. As the material constituting the hole injection layer, a PEDOT solution in which PEDOT is dissolved in a solvent made of xylene is produced, for example. Then, the produced PEDOT solution is spin-coated on the lower electrodes 16. Furthermore, the spin-coated PEDOT solution is dried, thus completing a hole injection layer.

Next, a light-emitting layer is formed on the hole injection layer. For example, α-NPD and $Alq_3$ serving as the materials for constituting a light-emitting layer are deposited on the hole injection layer by vacuum evaporation, thus completing a light-emitting layer.

Next, an electron injection layer is formed on the light-emitting layer. For example, a PPV solution in which polyphenylene vinylene (PPV) is dissolved in a solvent made of xylene or chloroform is produced as the material for constituting the electron injection layer. Then, the produced PPV solution is spin-coated on the light-emitting layer. Furthermore, the spin-coated PPV solution is dried, thus completing an electron injection layer. This completes an organic layer 20. Note that the thickness of the organic layer 20 may be varied for each of the organic layers 20a, 20b, and 20c, depending on the color filter R, G or B that is to be disposed.

Figure 13:
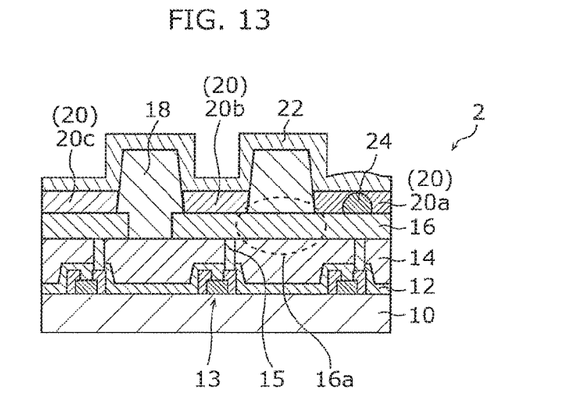
FIG. 13 is a schematic cross-sectional view showing the manufacturing process of the display panel according to Embodiment 1.

Subsequently, as shown in FIG. 13, an upper electrode 22 is formed on the organic layer 20 (step S15). For example, after the formation of the organic layer 20, the upper electrode 22 is continuously formed, without the substrate in which the organic layer 20 has been formed being exposed to the air. Here, a description will be given, taking, as an example, an upper electrode 22 having a configuration in which an ITO layer and a metal layer are stacked.

First, an ITO layer is formed on the organic layer 20. Specifically, ITO is deposited, by sputtering, on the electron injection layer that will constitute the organic layer 20. At this time, the thickness of the ITO is 75 nm, for example. The ITO layer at this time is in an amorphous state.

Next, a metal layer is formed on the ITO layer. Specifically, a metal for constituting the metal layer, such as Ag, is deposited on the ITO layer by sputtering. At this time, the thickness of the metal layer is 20 nm, for example. This completes an upper electrode 22.

Furthermore, a thin film sealing layer, a sealing resin layer, color filters, and a transparent glass are formed in order on the upper electrode 22.

Through the above-described manufacturing process, an organic EL display panel 2 is completed.

Note that the steps of forming the lower electrodes 16, the hole injection layer, the organic layer 20, the electron injection layer, and the upper electrode 22 are not limited by the present embodiment.

In the embodiment described above, after the formation of the lower electrodes 16, a lower electrode 16 including a defect is detected, subsequently the bank 18 is formed, and the protrusion 24 is formed thereafter. However, the protrusion 24 may be formed after the detection of a failure of the lower electrode 16 and before the formation of the bank 18, and the bank 18 may be formed thereafter.

1-3. Effects, Etc.

As described above, with the display panel manufacturing method according to the present embodiment, when a lower electrode 16 has a defect, the protrusion 24 is formed on the lower electrode 16, thus making it possible to short the lower electrode 16 and the upper electrode 22 by the protrusion 24. This makes it possible to change a defective pixel into a dark spot. Accordingly, it is possible to repair a defective pixel even when it is difficult to perform laser irradiation.

Embodiment 2

Next, Embodiment 2 will be described. In contrast to the organic EL display panel 2 including a defect in a lower electrode 16 in Embodiment 1 described above, an organic EL display panel according to the present embodiment includes a defect in a TFT 13.

Figure 14:
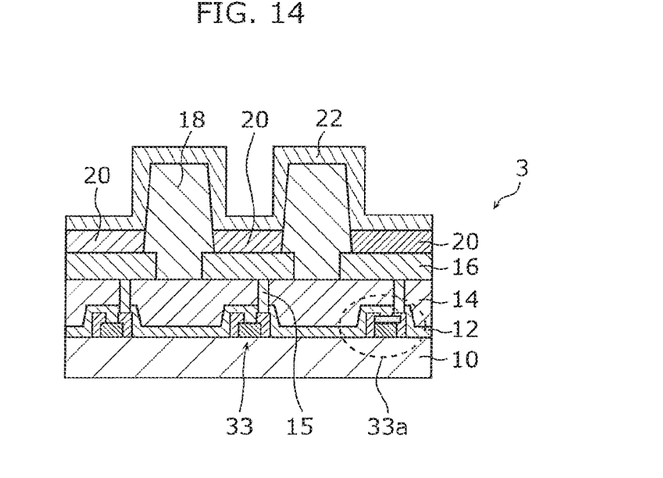
FIG. 14 is a schematic cross-sectional view of a display panel including a defect in a semiconductor element.

FIG. 14 is a schematic cross-sectional view of an organic EL display panel 3 including a defect in TFT.

As shown in FIG. 14, the organic EL display panel 3 includes, on a substrate 10, a semiconductor layer 12, a planarization film 14, lower electrodes 16, an organic layer 20, and an upper electrode 22, as with the organic EL display panel 1 described in Embodiment 1. A plurality of semiconductor elements 33 are formed in the semiconductor layer 12. The lower electrodes 16 are connected to at least one of the plurality of semiconductor elements 33. A bank 18 is formed on the planarization film 14, and regions surrounded by the bank 18 serve as pixels.

Here, the plurality of semiconductor elements 33 include those that have not been formed as the desired semiconductor elements 33 due to a patterning failure or the like during the manufacturing process, and a semiconductor element 33a including a defect is present. Therefore, a pixel in which a semiconductor element 33a including a defect is formed cannot be lit at the desired brightness. To solve this problem, an organic EL display panel 4 according to the present embodiment has the following configuration.

2-1. Configuration of Organic EL Element

Figure 15:
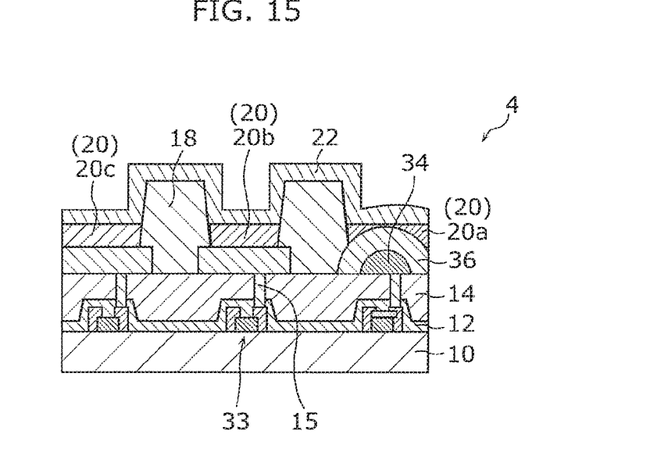
FIG. 15 is a schematic cross-sectional view showing a configuration of a display panel according to Embodiment 2.

In the following, a configuration of the organic EL element according to the present embodiment will be described. FIG. 15 is a schematic cross-sectional view showing the configuration of the organic EL display panel 4 according to the present embodiment.

As shown in FIG. 15, the organic EL display panel 4 is an organic functional device including, above a substrate 10, a planarization film 14, lower electrodes 16, an organic layer 20, a bank 18, and an upper electrode 22. The configurations of these components are the same as those of the organic EL display panel 2 described in Embodiment 1 above, and therefore, the detailed description thereof has been omitted. Due to the configuration of the organic EL display panel 4, when an appropriate voltage is applied between the lower electrodes 16 and the upper electrode 22, holes and electrons are injected into the organic layer 20 from the lower electrode 16 side and the upper electrode 22 side, respectively. The energy generated as a result of recombination of these injected holes and electrons in the organic layer 20 causes the light-emitting material of the organic layer 20 to be excited to emit light.

Here, in the organic EL display panel 4 shown in FIG. 15, a defect has occurred in at least one of the plurality of semiconductor elements 33 during the manufacturing process. This defect is, for example, a patterning failure, missing of members, or the like caused when the gate electrodes, the source electrodes, and the drain electrodes of the semiconductor elements 33 are formed by patterning. Due to this defect, the semiconductor element 33a does not operate normally, and therefore, the pixel including the semiconductor element 33a has a light emission problem, for example, that the pixel cannot be lit at the desired brightness.

To solve this problem, the organic EL display panel 4 shorts the upper electrode 16 and the lower electrode 22 in the pixel in which the semiconductor element 33a including a defect is formed, thus changing the pixel into a dark spot. To change the pixel into a dark spot, the organic EL display panel 4 includes the protrusion 34 on the planarization film 14 in the pixel in which the semiconductor element 33a including a defect is disposed.

For example, the protrusion 34 is composed of an electrically conductive material such as indium. In a portion in which the protrusion 34 is formed, the lower electrode 16 on the protrusion 34 is formed in a raised shape in conformity with the shape of the protrusion 34. Consequently, the lower electrode 16 and the upper electrode 22 formed thereabove are connected. Accordingly, the lower electrode 16 and the upper electrode 22 are shorted, the organic layer 20 does not emit light in the pixel including the shorted lower electrode 16, and the pixel is changed into a dark spot. Thus, by forming the protrusion 34 on the planarization film 14, it is possible to eliminate a light emission problem of the pixel in which the semiconductor element 33a including a defect is formed.

Note that the protrusion 34 may not be formed of an electrically conductive material, and may be formed of, for example, a paste made of polyimide, acrylic, or an inorganic or organic material.

2-2. Manufacturing Method of Organic EL Element

Figure 16:
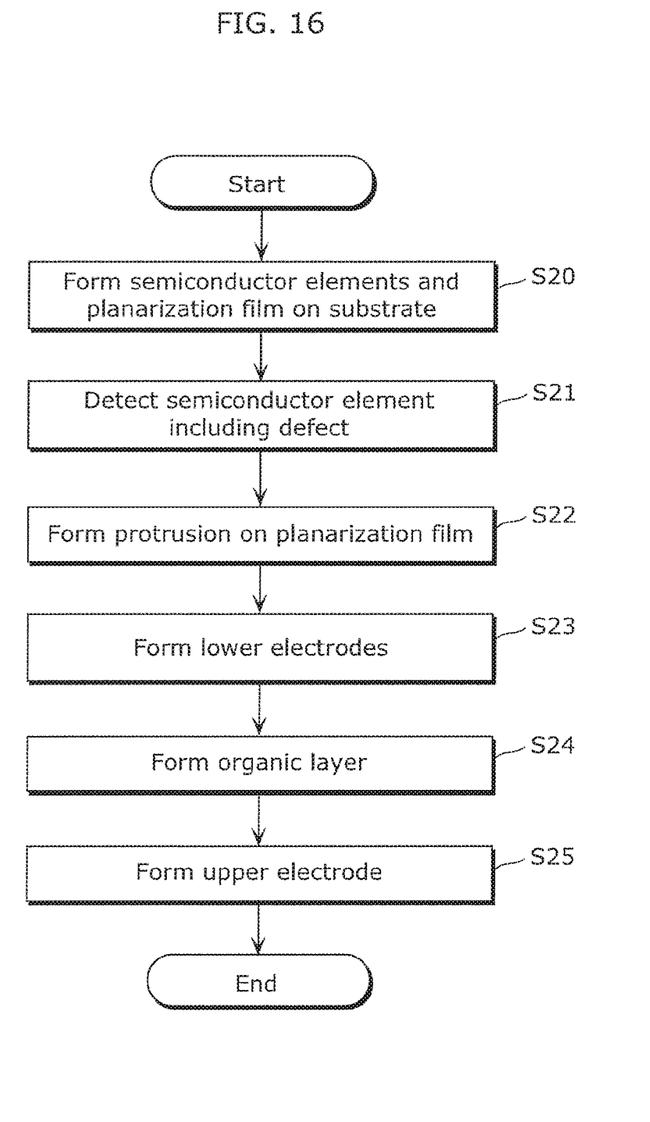
FIG. 16 is a flowchart illustrating a manufacturing process of the display panel according to Embodiment 2.

In the following, a manufacturing method of the organic EL display panel 4 will be described with reference to FIGS. 16 to 26. FIG. 16 is a flowchart illustrating a manufacturing process of the organic EL display panel 4 according to the present embodiment. FIGS. 17 to 26 are schematic cross-sectional views showing the manufacturing process of the organic EL element according to the present embodiment.

The following description will be given with reference to the flowchart in FIG. 16.

Figure 17:
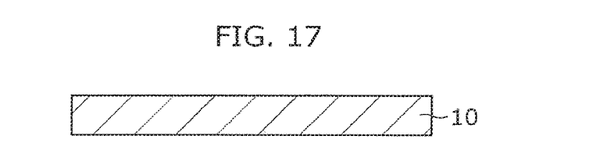
FIG. 17 is a schematic cross-sectional view showing the manufacturing process of the display panel according to Embodiment 2.
Figures 18, 19:
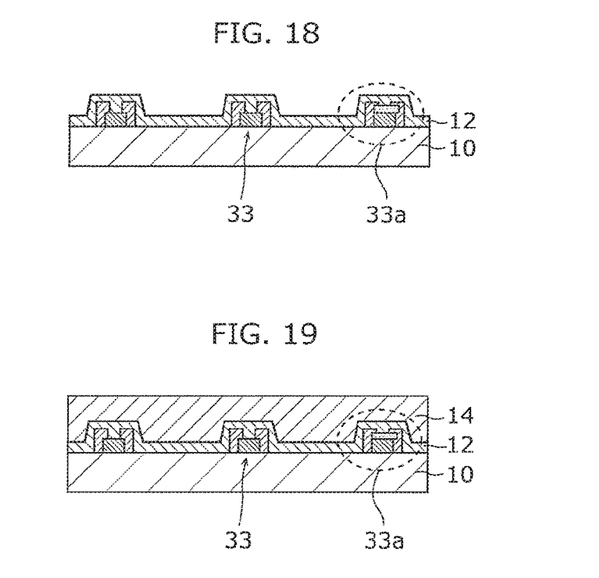
FIG. 18 is a schematic cross-sectional view showing the manufacturing process of the display panel according to Embodiment 2.
FIG. 19 is a schematic cross-sectional view showing the manufacturing process of the display panel according to Embodiment 2.

First, as shown in FIG. 17, a substrate 10 is provided, as with the organic EL display panel 2 described in Embodiment 1. Subsequently, as shown in FIG. 18, a semiconductor layer 12 including semiconductor elements 33 is formed on the substrate 10 (step S20). At this time, there is the possibility that a semiconductor element 33a including a defect may be formed as a result of a patterning failure or the like.

Figure 20:
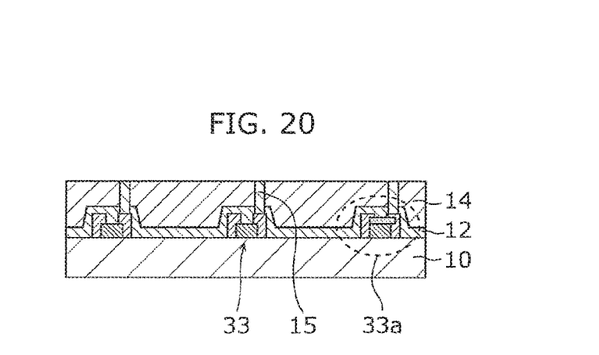
FIG. 20 is a schematic cross-sectional view showing the manufacturing process of the display panel according to Embodiment 2.

Next, as shown in FIG. 19, a planarization film 14 made of an insulating organic material is formed on the semiconductor layer 12 (step S20). Thereafter, as shown in FIG. 20, through-holes extending from the surface of the planarization film 14 to the plurality of semiconductor elements 13 are formed at the locations of the semiconductor elements 33. Furthermore, an electrically conductive material is filled into the through-holes. This completes vias 15.

Here, a semiconductor element 33a including a defect is detected (step S21). A semiconductor element 33a including a defect is detected, for example, by capturing, with an imaging device equipped with a microscope, an image of the plane of the substrate on which the semiconductor element 33 has been formed, and visually inspecting the captured image to detect a semiconductor element 33a including a defect. Note that the semiconductor element 33a including a defect may not be necessarily detected by visual inspection of the captured image, and may be detected, for example, by an electrical method such as detecting the semiconductor element 33a by bringing a probe into contact therewith.

Figure 21:
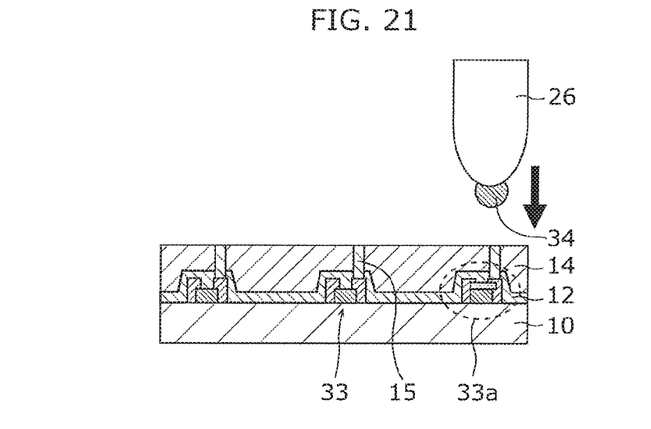
FIG. 21 is a schematic cross-sectional view showing the manufacturing process of the display panel according to Embodiment 2.
Figure 22:
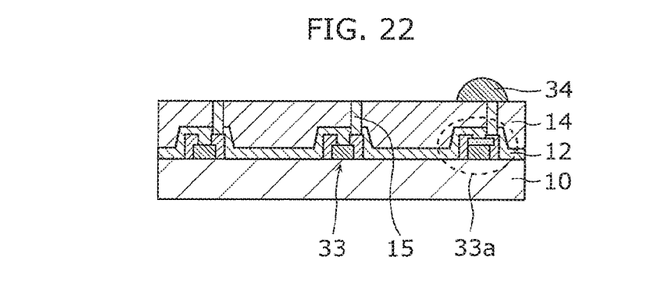
FIG. 22 is a schematic cross-sectional view showing the manufacturing process of the display panel according to Embodiment 2.

Subsequently, as shown in FIGS. 21 and 22, a protrusion 34 is formed on the planarization film 14 of the pixel in which the semiconductor element 33a including a defect is formed (step S22). The protrusion 34 is formed, for example, by using a coating needle 26 for use in applying the material of the bank 18 or the organic layer 20 during formation of these components. Using the coating needle 26, an electrically conductive paste serving as the material for constituting the protrusion 34 is added dropwise onto at least a portion located on the lower electrode 16 having the semiconductor element 33a including a defect. Then, the added conductive paste is dried, thus completing a protrusion 34.

Note that the protrusion 34 may be formed by using a paste made of polyimide, acrylic, or an inorganic or organic material, instead of using an electrically conductive paste.

Figure 23:
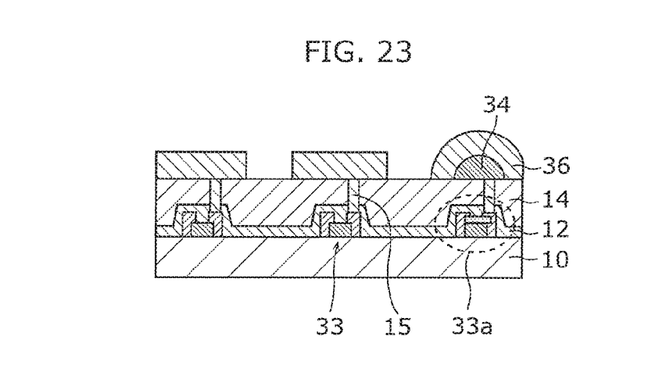
FIG. 23 is a schematic cross-sectional view showing the manufacturing process of the display panel according to Embodiment 2.

Subsequently, as shown in FIG. 23, lower electrodes 16 are formed on the planarization film 14 (step S23). The lower electrodes 16 are formed by deposition and patterning. In a portion in which the protrusion 34 is formed on the planarization film 14, the lower electrode 16 is formed on the protrusion 34.

First, Al is deposited on the planarization film 14 and the protrusion 34 by sputtering so as to have a thickness of 300 nm. Subsequently, the deposited Al is patterned into a predetermined shape by photolithography and wet etching. This completes a plurality of lower electrodes 16.

Figure 24:
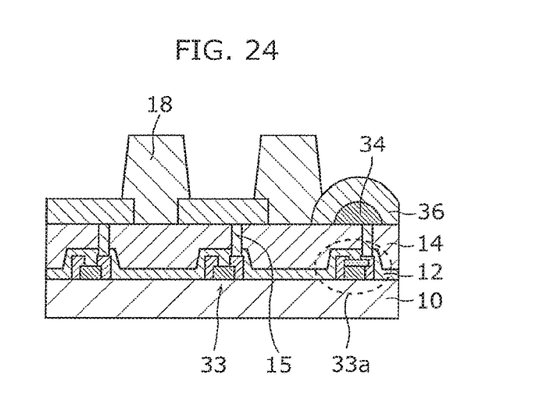
FIG. 24 is a schematic cross-sectional view showing the manufacturing process of the display panel according to Embodiment 2.
Figure 25:
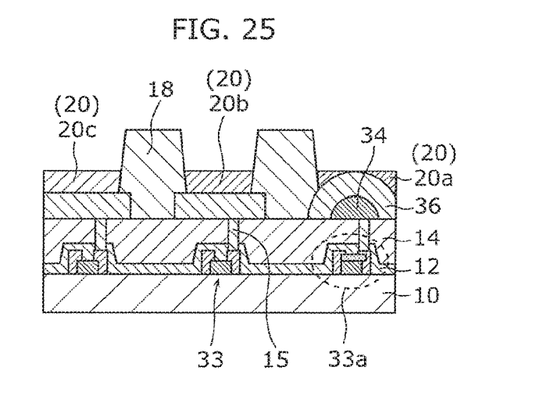
FIG. 25 is a schematic cross-sectional view showing the manufacturing process of the display panel according to Embodiment 2.

Next, as shown in FIG. 24, a bank 18 is formed on the planarization film 14 and the lower electrodes 16, as with the organic EL display panel 2 described in Embodiment 1. Furthermore, as shown in FIG. 25, organic layers 20a, 20b, and 20c are formed on the corresponding ones of the lower electrodes 16 separated into a plurality of pixels by the bank 18 (step S24). Note that the organic layer 20 may be configured to include a hole injection layer and an electron injection layer, in addition to the light-emitting layer.

Figure 26:
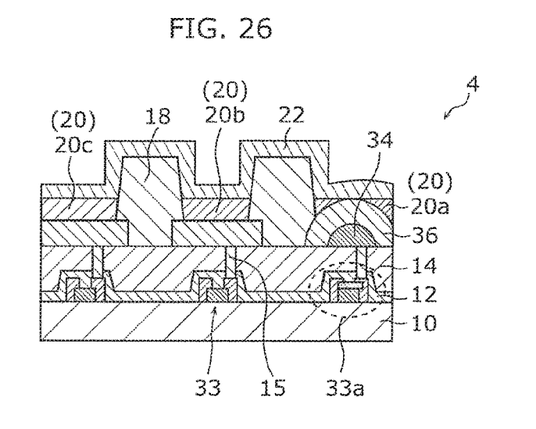
FIG. 26 is a schematic cross-sectional view showing the manufacturing process of the display panel according to Embodiment 2.

Subsequently, as shown in FIG. 26, an upper electrode 22 is formed on the organic layer 20 (step S25). The upper electrode 22 may have a configuration in which an ITO layer and a metal layer are stacked.

Furthermore, a thin film sealing layer, a sealing resin layer, color filters, and a transparent glass are formed in order on the upper electrode 22.

Through the above-described manufacturing process, an organic EL display panel 4 is completed.

Note that the steps of forming the lower electrodes 16, the hole injection layer, the organic layer 20, the electron injection layer, and the upper electrode 22 are not limited by the present embodiment.

In the embodiment described above, the detection of a semiconductor element 33a including a defect is performed after the planarization film 14 has been formed on the semiconductor element 33, and the vias 15 are further formed thereon. However, the configuration is not limited thereto, and the detection may be performed immediately after the formation of the semiconductor elements 33, or immediately after the production of the planarization film 14.

Although the protrusion 34 is formed on the planarization film 14 in the embodiment described above, the position at which the protrusion 34 is formed is not limited to a position located on the planarization film 14. The protrusion 34 may be formed at any position, so long as the lower electrode 16 and the upper electrode 22 can be shorted. For example, the protrusion 34 may be formed on the upper electrode 16, as with the protrusion 24 described in Embodiment 1.

2-3. Effects, Etc.

As described above, with the display panel manufacturing method according to the present embodiment, when the semiconductor elements 33 include a defect, the protrusion 34 is formed on the planarization film 14 located above the semiconductor element 33a including a defect, thus enabling the lower electrode 16 on the protrusion 34 to be formed in conformity with the shape of the protrusion 34. Consequently, the lower electrode 16 formed in conformity with the shape of the protrusion 34 and the upper electrode 22 can be shorted. Accordingly, it is possible to change a defective pixel into a dark spot. Thus, it is possible to repair a defective pixel even when it is difficult to perform laser irradiation.

Other Embodiments

It should be appreciated that the present invention is not limited to the embodiments described above, and various improvements and modifications may be made without departing from the gist of the invention.

For example, the embodiments described above show a configuration in which the lower electrode serves as the positive electrode, and the upper electrode serves as the negative electrode. However, it is possible to adopt a configuration in which the lower electrode serves as the negative electrode, and the upper electrode serves as the positive electrode. The configurations of the planarization film, the positive electrode, the hole injection layer, the light-emitting layer, the bank, the electron injection layer, the negative electrode, the thin film sealing layer, the sealing resin layer, and the transparent glass, which constitute the organic EL element, are not limited to those shown in the embodiments described above, and the materials, the configurations, and the forming methods thereof may be changed. For example, the hole transport layer may be present between the hole injection layer and the light-emitting layer, or the electron transport layer may be present between the electron injection layer and the light-emitting layer. It is also possible to adopt a configuration in which the color filters for adjusting the colors of red, green, and blue are provided under the transparent glass so as to cover the pixels separated by the bank.

Figure 27:
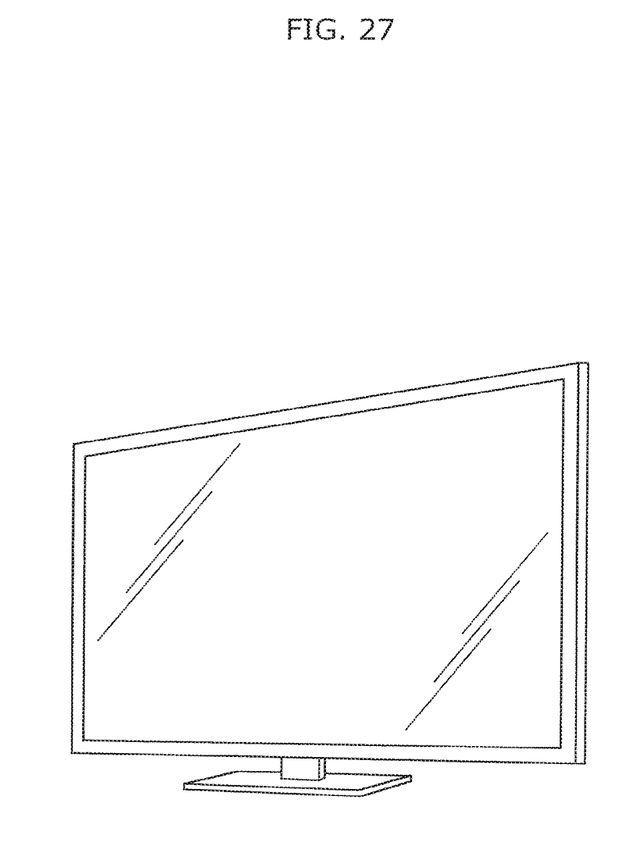
FIG. 27 is a schematic configuration diagram of a thin flat panel system including an organic EL display panel.

The scope of the present invention also encompasses other embodiments obtained by making various modifications conceived by a person skilled in the art to the embodiments disclosed herein, as well as embodiments implemented by any combination of the components of other embodiments without departing from the gist of the present invention. For example, a thin flat television system, as shown in FIG. 27, including an organic EL element according to the present invention is also encompassed by the invention.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

An organic EL element manufacturing method and an organic EL element according to the present invention are particularly useful for technical fields of thin-screen televisions and personal computer displays for which a large screen and a high resolution are required.

The invention claimed is:

1. A display panel including a plurality of pixels, each of the plurality of pixels having an organic electroluminescent element, the display panel comprising:
  a plurality of semiconductor elements disposed on a substrate;
  a planarization film disposed above the plurality of semiconductor elements;
  a plurality of lower electrodes disposed on the planarization film in one-to-one correspondence with the plurality of pixels, the plurality of lower electrodes including a defective lower electrode;
  an organic layer disposed on the lower electrodes and including a light-emitting layer;
  an upper electrode disposed on the organic layer; and
  a protrusion disposed on the planarization film or the defective lower electrode, the protrusion is configured to electrically connect the defective lower electrode with a portion of the upper electrode disposed above the protrusion,
  wherein
  the protrusion is disposed above a region over the defective lower electrode.

2. A display panel including a plurality of pixels, each of the plurality of pixels having an organic electroluminescent element, the display panel comprising:
  a plurality of semiconductor elements disposed on a substrate, the plurality of semiconductor elements including a defective semiconductor element;
  a planarization film disposed above the plurality of semiconductor elements;
  a plurality of lower electrodes disposed on the planarization film in one-to-one correspondence with the plurality of pixels;
  an organic layer disposed on the plurality of lower electrodes, the organic layer including a light-emitting layer;
  an upper electrode disposed on the organic layer; and
  a protrusion disposed on the planarization film or a target lower electrode that is disposed above the defective semiconductor element, the protrusion is configured to electrically connect the target lower electrode with a portion of the upper electrode disposed above the protrusion,
  wherein the protrusion is disposed above a region over the defective semiconductor element.

3. The display panel according to claim 1,
wherein the protrusion includes an electrically conductive material.

4. The display panel according to claim 2,
wherein the protrusion includes an electrically conductive material.

5. The display panel according to claim 1,
wherein a location of the defective lower electrode is detected among the plurality of lower electrodes, and the protrusion is disposed above the location of the defective lower electrode.

6. The display panel according to claim 2,
wherein a location of the defective lower electrode is detected among the plurality of lower electrodes, and the protrusion is disposed above the location of the defective lower electrode.

7. The display panel according to claim 1,
wherein the protrusion is disposed over only the region over the defective lower electrode among the plurality of lower electrodes.

8. The display panel according to claim 2,
wherein the protrusion is disposed over only the region over the defective lower electrode among the plurality of lower electrodes.

9. The display panel according to claim 1,
wherein the protrusion is a separate component that is disposed on a surface of the defective lower electrode.

10. The display panel according to claim 2
wherein the protrusion is a separate component that is disposed on a surface of the defective lower electrode.

11. The display panel according to claim 1,
wherein the organic layer is in direct contact with a surface of the upper electrode.

12. The display panel according to claim 2,
wherein the organic layer is in direct contact with a surface of the upper electrode.

13. The display panel according to claim 1,
wherein the protrusion is a separate component from the lower electrodes and the upper electrode, and the protrusion is interposed between the defective lower electrode and the upper electrode.

14. The display panel according to claim 2,
wherein the protrusion is a separate component from the lower electrodes and the upper electrode, and the protrusion is interposed between the defective lower electrode and the upper electrode.

* * * * *